United States Patent
Mori et al.

(10) Patent No.: US 7,362,630 B2
(45) Date of Patent: Apr. 22, 2008

(54) SEMICONDUCTOR MEMORY

(75) Inventors: Kaoru Mori, Kawasaki (JP); Yoshiaki Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/714,766

(22) Filed: Mar. 7, 2007

(65) Prior Publication Data

US 2007/0195620 A1     Aug. 23, 2007

Related U.S. Application Data

(62) Division of application No. 11/258,936, filed on Oct. 27, 2005, now Pat. No. 7,196,951.

(30) Foreign Application Priority Data

Jun. 30, 2005   (JP) .............................. 2005-191333

(51) Int. Cl.
    *G11C 29/00* (2006.01)
(52) U.S. Cl. ............. 365/200; 365/189.07; 365/230.03
(58) Field of Classification Search ................. 365/200
    See application file for complete search history.

(56) References Cited

U.S. PATENT DOCUMENTS

| | | | | |
|---|---|---|---|---|
| 5,392,246 | A * | 2/1995 | Akiyama et al. | ........... 365/200 |
| 5,894,441 | A   | 4/1999 | Nakazawa | |
| 6,055,196 | A * | 4/2000 | Takai | .......................... 365/200 |
| 6,259,636 | B1* | 7/2001 | Fukuda et al. | ............... 365/200 |
| 6,421,284 | B1* | 7/2002 | Sakata | ........................ 365/200 |
| 6,466,493 | B1  | 10/2002 | Menke et al. | |
| 6,711,074 | B2  | 3/2004 | Kwon | |
| 6,826,712 | B2  | 11/2004 | Ono | |
| 6,856,561 | B2* | 2/2005 | Kato et al. | ................... 365/200 |

FOREIGN PATENT DOCUMENTS

| JP | 2002-8390 A | 1/2002 |
|---|---|---|
| JP | 2002-512416 A | 4/2002 |
| JP | 2003-16795 A | 1/2003 |

OTHER PUBLICATIONS

Kiyohiro Furutani, et al., "Highly Flexible Row and Column Redundancy and Cycle Time Adaptive Read Data Path for Double Data Rate Synchronous Memories", IEICE Trans. Electron., vol. E88-C, No. 2, Feb. 2005, pp. 255-263.

* cited by examiner

*Primary Examiner*—Son L. Mai
(74) *Attorney, Agent, or Firm*—Arent Fox, LLP.

(57) ABSTRACT

In order to give all memory blocks the same structure, a redundancy word line and a redundancy bit line are formed in each memory block. A redundancy column selection line is wired in common to the memory blocks. Column redundancy circuits are formed to correspond to respective memory groups each of which consists of a prescribed number of memory blocks, and become effective according to enable signals. A column redundancy selection circuit activates an enable signal according to a block address signal when all row hit signals are deactivated. When one of the row hit signals is activated, the column redundancy selection circuit activates the enable signal corresponding to the activated row hit signal. Since the column redundancy circuit for an arbitrary memory group can be made effective according to the row hit signals, failure relief efficiency can be increased without deteriorating the electric characteristic during an access operation.

10 Claims, 11 Drawing Sheets

| /RHIT01 | L | H | L | H | L | H | L | H |
|---------|---|---|---|---|---|---|---|---|
| /RHIT23 | H | H | H | H | L | L | L | L |
| RAD22   | L | H | L | H | L | H | L | H |
| COM0ENZ | H | L | H | L | H | L | H | L |
| COM1ENZ | L | H | L | H | L | H | L | H |

Fig. 5

| /RHIT01 | L | H | L | H | L | H |
|---|---|---|---|---|---|---|
| /GRHIT | H | H | L | L | L | L |
| RAD22 | L | H | L | H | L | H |
| COM0ENZ | H | L | H | H | L | L |
| COM1ENZ | L | H | L | L | H | H |

Fig. 8

| | | | | | | | | | | | | |
|---|---|---|---|---|---|---|---|---|---|---|---|---|
| /RHIT0 | L | H | L | H | H | H | H |
| /RHIT1 | H | H | H | H | H | H | H |
| /RHIT2 | H | H | H | H | L | H | H |
| /RHIT3 | H | H | H | H | H | H | L |
| RAD22 | L | H | L | H | L | H | L | H | L | H | L | H | L | H |
| RAD21 | L | L | H | H | L | L | H | H | L | L | H | H | L | L | H | H |
| COM0ENZ | H | L | L | L | H | L | L | L | L | L | L | L | L | L | L | L |
| COM1ENZ | L | H | L | L | L | H | L | L | L | H | L | L | L | L | L | L |
| COM2ENZ | L | L | H | L | L | L | H | L | L | L | H | L | L | L | L | L |
| COM3ENZ | L | L | L | H | L | L | L | H | L | L | L | H | L | L | L | H |

Fig. 11

SEMICONDUCTOR MEMORY

This is a divisional of U.S. patent application Ser. No. 11/258,936, filed Oct. 27, 2005, U.S. Pat. No. 7,196,951, which claims priority benefit to JP 2005-191333, filed Jun. 30, 2005. The disclosure of all applications is hereby incorporated by reference in their entirety.

BACKGROUND OF THE INVENTION

1. Field of the Invention

The present invention relates to a semiconductor memory having column selection lines which are wired in common to plural memory blocks and redundancy circuits that relieve from failures.

2. Description of the Related Art

In general, semiconductor memories such as DRAMs have not only real memory cells but also redundancy circuits such as redundancy memory cells in order to increase the yield by taking relief measures against failures due to crystal defects in a semiconductor substrate, particles introduced during a fabrication process, and the like. More specifically, for example, redundancy word lines (row redundancy circuit) that replace word lines and redundancy bit lines (column redundancy circuit) that replace bit lines are formed in each memory block.

Patent document 1 discloses a technique that increases the efficiency of relief from failures in a semiconductor memory having a pair of memory blocks using redundancy circuits. That is, relief from a failure in one memory block is attained by using a redundancy word line or a redundancy bit line of the other memory block. However, in this technique, it is necessary to form a column decoder for each memory block. Further, since a row block address is used in selecting a real bit line, the column decoders become large and fuse circuits for column redundancy become large, which results in increase in chip size.

Patent document 2 and Non-patent document 1 disclose examples of semiconductor memories that can relieve failures in one memory block by using a redundancy circuit of the other memory block, in which plural column redundancy circuits are formed so as to correspond to respective memory groups each having a prescribed number of memory blocks and have redundancy column selection lines that are common to plural memory blocks. In this kind of semiconductor memory, the chip size can be reduced because of the common use of a column decoder. Further, by using the common redundancy column selection lines, bit line failures and the like can have relief attained on a memory block basis.

Patent document 1: Japanese Internal Publication No. 2002-512416

Patent document 2: Japanese Unexamined Patent Application Publication No. 2003-16795

Non-patent document 1: Kiyohiro FURUTANI, Takeshi HAMAMOTO, Takeo MIKI, Masaya NAKANO, Takashi KONO, Shigeru. KIKUDA, Yasuhiro KONISHI, and Tsutomu YOSHIHARA, "Highly Flexible Row and Column Redundancy and Cycle Time Adaptive Read Data Path for Double Data Rate Synchronous Memories," IEICE TRANS. ELECTRON., Vol. E88-C, No. 2, February 2005

However, in Patent document 2, relief for word line (row redundancy) can be attained only in a pair of memory blocks. In other words, a word line cannot attain relief by using the redundancy circuit of an arbitrary memory block. Therefore, when, for example, failures caused by a large particle occur in one memory block in a concentrated manner, there may not be enough redundancy circuits relieving those failures. In this case, the relief efficiency lowers and hence the yield lowers.

In Non-patent document 1, redundancy word lines are formed in only one of a pair of memory blocks. The bit lines are longer and the load capacitance of each bit line is larger in the memory block having the redundancy word lines than in the memory block not having the redundancy word lines. Therefore, the access time is longer in the memory block having the redundancy word lines than in the memory block not having the redundancy word lines. That is, the electric characteristic during an access operation is worse when the structures of the memory blocks differ.

Among conventional semiconductor memories in which plural column redundancy circuits are formed so as to correspond to respective memory groups each having a prescribed number of memory blocks and to have redundancy column selection lines that are common to plural memory blocks, there have been no semiconductor memories in which the memory blocks have the same structure and can relieve failures occurred in a certain memory block by using the redundancy circuit of an arbitrary memory block. In other words, to solve the above problems at the same time, it is necessary to provide a special column redundancy selection circuit that selects a redundancy column selection line (column redundancy circuit). However, no such column redundancy selection circuits have been proposed.

SUMMARY OF THE INVENTION

An object of the present invention is to increase the failure relief efficiency without deteriorating the electric characteristic during an access operation.

According to a first aspect of the present invention, each memory block includes a real cell array, a row redundancy cell array, and a column redundancy cell array. The real cell array has a plurality of real memory cells arranged in matrix form. The row redundancy cell array has a plurality of row redundancy memory cells arranged in a row direction and a redundancy word line connected to the row redundancy memory cells. The column redundancy cell array has a plurality of column redundancy memory cells arranged in a column direction and a redundancy bit line connected to the column redundancy memory cells. All the memory blocks can be given the same structure, in this manner, by forming the redundancy word line and the redundancy bit line in every memory block. Accordingly, all the memory blocks can exhibit the same electric characteristic during an access operation.

A plurality of redundancy column switches connect the redundancy bit lines to a data bus line. A redundancy column selection line is connected to the redundancy column switches to operate the redundancy column switches, and wired in common to the memory blocks. A plurality of row redundancy circuits are formed so as to correspond to the respective redundancy word lines. Each row redundancy circuit receives an external row address signal, and activates a row hit signal that selects the corresponding redundancy word line when the received external row address signal coincides with a row address which is a failure or defective programmed in advance.

A plurality of column redundancy circuits are formed so as to correspond to respective memory groups each consisting of a prescribed number of memory blocks. Each column redundancy circuit operates when activated in response to a corresponding enable signal, receives an external column address signal, and activates a column hit signal that selects the redundancy column selection line when the received external column address signal coincides with a column address which is a failure or defective programmed in advance.

A column redundancy selection circuit activates the enable signal corresponding to a column redundancy circuit of one of the memory groups indicated by the block address signal when all of the row hit signals are deactivated, that is, no redundancy word lines are used. At this time, the column redundancy circuit corresponding to the block address signal becomes effective. The column redundancy selection circuit activates the enable signal that activates a column redundancy circuit of one of the memory groups corresponding to the activated row hit signal when one of the row hit signals is activated, that is, a redundancy word line is used. Therefore, the column redundancy circuit of the arbitrary memory group can be made effective according to the row hit signals. In other words, it becomes possible to use the redundancy word line and a redundancy bit line simultaneously and to thereby improve the failure relief efficiency. Further, when failures occurs in a certain memory block in a concentrated manner, the failure relief efficiency can be improved by relieving the failure using redundancy word lines of plural memory blocks including the memory block where the failures have occurred. As a result, the failure relief efficiency can be raised without deteriorating the electric characteristic during an access operation.

In a preferred example of the first aspect of the present invention, the column redundancy selection circuit includes a plurality of address decoders which are formed so as to correspond to the respective memory groups and output the respective enable signals. Each of the address decoders includes a decoder part and a reset part. The decoder part activates the enable signal in response to either one of activation of the block address signal and the corresponding row hit signal. The reset part fixes the enable signal output node of the decoder part at a deactivation level in response to activation of the row hit signal not corresponding. According to the present invention, the column redundancy selection circuit can be formed easily by using the decoder parts and the reset parts.

A second aspect of the present invention is different from the above-described first aspect in the row redundancy circuits and the column redundancy selection circuit. A plurality of row redundancy circuits are formed so as to correspond to the respective redundancy word lines. Each row redundancy circuit receives an external row address signal, and activates a row hit signal that selects the corresponding redundancy word line and activates a global row hit signal that prohibits selection of the real word line when the received external row address signal coincides with a row address which is a failure or defective programmed in advance. The global row hit signal is transmitted to the global row hit signal line which is wired in common to the memory blocks.

The column redundancy selection circuit receives the global row hit signal, a close row hit signal that is a row hit signal from row redundancy circuits corresponding to one of the memory groups located relatively near by, and a block address signal that selects one of the memory groups. The column redundancy selection circuit activates an enable signal corresponding to the column redundancy circuit of one of the memory groups indicated by the block address signal when the global row hit signal and the close row hit signal are deactivated. The column redundancy selection circuit activates an enable signal that activates the column redundancy circuit of one of the memory groups corresponding to the close row hit signal when the close row hit signal is activated. Further, the column redundancy selection circuit activates the enable signal that activates the column redundancy circuit of one of the memory groups not corresponding to the close row hit signal when the close row hit signal is deactivated and the global row hit signals is activated. In the second aspect, like the first aspect, the failure relief efficiency can be raised without deteriorating the electric characteristic during an access operation. In addition, by utilizing the global row hit signal instead of the row hit signals from the row redundancy circuits corresponding to the memory group which is located relatively in distance, it is possible to decrease the number of signal lines (interconnections) that transmit the row hit signals to the column redundancy selection circuit. As a result, the chip size of the semiconductor memory can be reduced.

In a preferred example of the second aspect of the present invention, the column redundancy selection circuit includes a pair of address decoders which are formed so as to correspond to the respective memory groups and output the respective enable signals. An address decoder corresponding to one of the memory groups located relatively near by includes a decoder part which activates the corresponding enable signal in response to either one of activation of the block address signal and the close row hit signal, and a reset part which fixes an output node for the corresponding enable signal at a deactivation level in response to deactivation of the close row hit signal and activation of the global row hit signal.

An address decoder corresponding to other one of the memory groups that is located relatively in distance includes a decoder part which activates the corresponding enable signal in response to either one of the block address signal and deactivation of the close row hit signal as well as activation of the global row hit signal, and a reset part which fixes an output node for the corresponding enable signal at a deactivation level in response to activation of the close row hit signal. With this measure, the column redundancy selection circuits can be formed by using the simple decoder parts and reset parts as described above, that is, also in the case of selecting a column redundancy circuit using the global row hit signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory chart showing how the column redundancy selection circuit shown in FIG. 2 operates;

FIG. 8 is an explanatory chart showing how the column redundancy selection circuit of FIG. 7 operates;

FIG. 11 is an explanatory chart showing how the column redundancy selection circuit of FIG. 10 operates.

DESCRIPTION OF THE PREFERRED EMBODIMENTS

Figure 1:
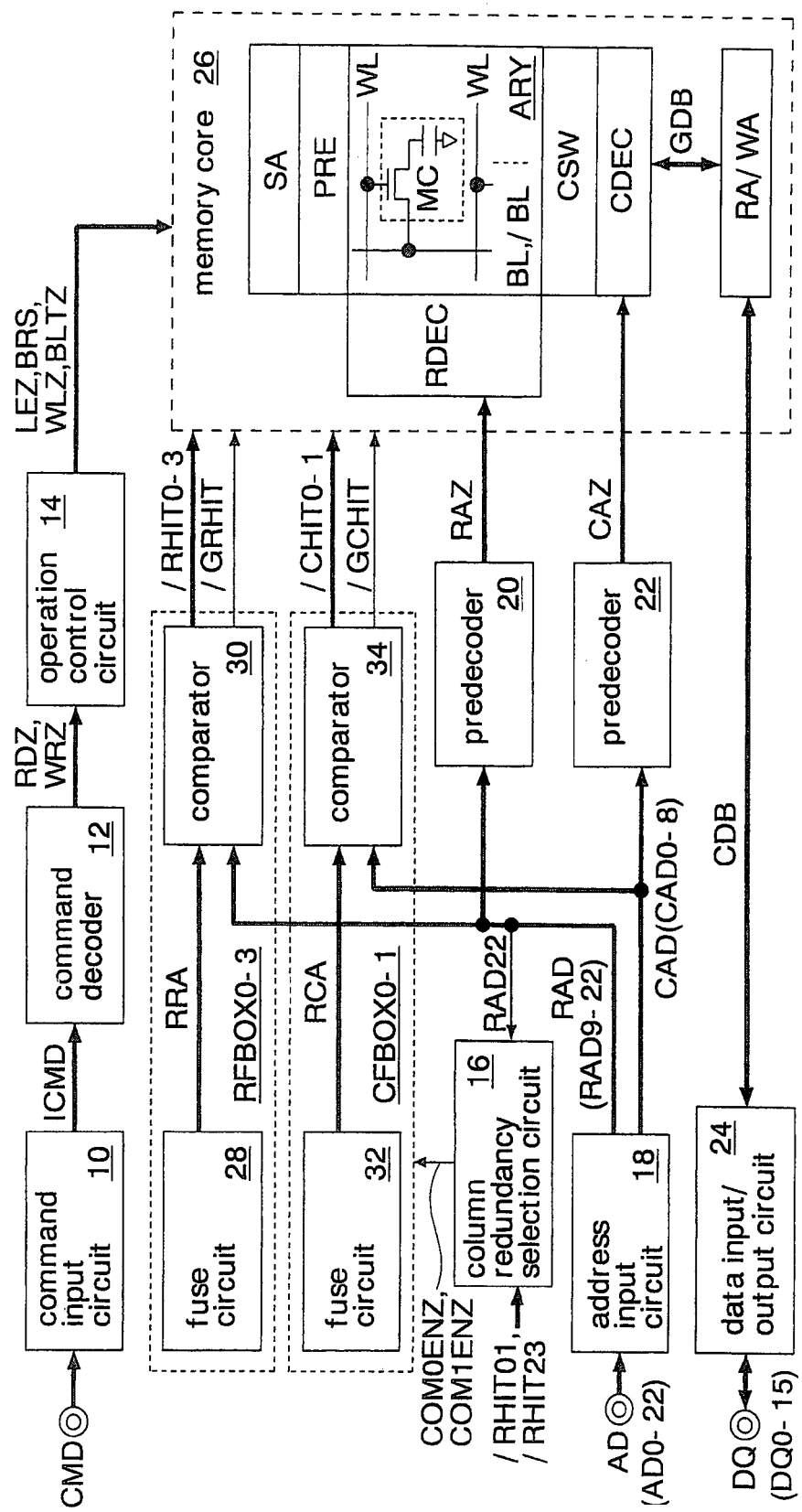
FIG. 1 is a block diagram showing a semiconductor memory according to a first embodiment of the present invention.

Embodiments of the present invention will be hereinafter described with reference to the drawings. Double circles in the drawings represent external terminals. In the drawings, each signal line represented by a thick line consists of plural lines. Part of blocks to which a thick line(s) is connected includes plural circuits. Each signal line for transmitting a signal is denoted by a symbol that is the same as a name of the signal. Signals that are denoted by symbols headed by a mark "/" are negative logic signals. Signals that are denoted by symbols having "Z" at the tail are positive logic signals.

FIG. 1 shows a semiconductor memory according to a first embodiment of the invention. This semiconductor memory is an FCRAM (fast cycle RAM) which is based on the CMOS technology and has DRAM memory cells (dynamic memory cells) and SRAM interfaces. The FCRAM, which is a kind of pseudo SRAM, performs a refresh operation regularly inside the chip without receiving an external refresh command and holds data that have been written to the memory cells. This FCRAM is used as a work memory that is incorporated in a mobile phone. The invention can be applied to both of a clock synchronous FCRAM and a clock asynchronous FCRAM.

The FCRAM is equipped with a command input circuit 10, a command decoder 12, an operation control circuit 14, a row redundancy circuit FRBOX (RFBOX0-3), a column redundancy circuit CFBOX (CFBOX0-1), a column redundancy selection circuit 16, an address input circuit 18, predecoders 20 and 22, a data input/output circuit 24, and a memory core 26. In addition to the circuits shown in FIG. 1, the RCRAM is equipped with, for example, a booster for generating a high voltage level for word lines etc.

The command input circuit 10 receives a command signal CMD (external access request signal) that is supplied via a command terminal CMD, and outputs the received signal as an internal command signal ICMD. For example, the command signal CMD includes a chip enable signal /CE, an output enable signal /OE, a write enable signal /WE, an upper byte signal /UB, and a lower byte signal /LB.

The command decoder 12 decodes the internal command signal ICMD and outputs a read signal RDZ for execution of a read operation or a write signal WRZ for execution of a write operation.

When receiving the read signal RDZ or the write signal WRZ, the operation control circuit 14 outputs a sense amplifier activation signal LEZ, a bit line reset signal BRS, a word line timing signal WLZ, and a bit line transfer signal BLTZ to cause the memory core 36 to perform a read operation or a write operation. The operation control circuit 14 is equipped with a refresh timer, a refresh counter, and an arbiter which determines priority order of an external access request and an internal refresh request from the refresh timer.

The row redundancy circuits RFBOX0-3 operate to use redundancy word lines RWL instead of word lines WL. Each of the row redundancy circuit RFBOX0-3 is equipped with a fuse circuit 28 having fuses for programming of a failure row address and a comparator 30. The fuse circuit 28 outputs a programmed row address as a redundancy row address signal RRA. If coincidence is found between a row address signal RAD and the redundancy row address signal RRA, the comparator 30 activates a row hit signal /RHIT (/RHIT0-3) to select a corresponding redundancy word line RWL and activates a global row hit signal /GRHIT to prohibit activation of real word lines. The row redundancy circuits RFBOX0-3 are formed for the respective redundancy word lines RWL. To simplify the description, this embodiment is directed to the case that the four row redundancy circuits RFBOX0-3 are formed. Actually, however, two or four row redundancy circuits are formed for each of row blocks RBLK 0-3 shown in FIG. 2 (described later).

The column redundancy circuits CFBOX0-1 operate to use a redundancy bit line pair RBL and /RBL instead of a bit line pair BL and /BL. Each of the column redundancy circuits CFBOX0-1 is equipped with a fuse circuit 32 having fuses for programming of a failure column address and a comparator 34. The fuse circuit 32 outputs a programmed column address as a redundancy column address signal RCA. The comparator 34 operates while a corresponding one of enable signals COM0ENZ and COM1ENZ is activated. If coincidence is found between a column address signal CAD and the redundancy column address signal RCA, the comparator 34 activates a column hit signal /CHIT (/CHIT0-1) and a global column hit signal /QCHIT. The column redundancy circuits CFBOX0-1 are formed for the respective redundancy bit line pairs RBL and /RBL. To simplify the description, this embodiment is directed to the case that the two column redundancy circuits CFBOX0-1 are formed. Actually, however, two or four column redundancy circuits are formed for each of memory groups MG0-1 shown in FIG. 2 (described late r).

Figure 2:
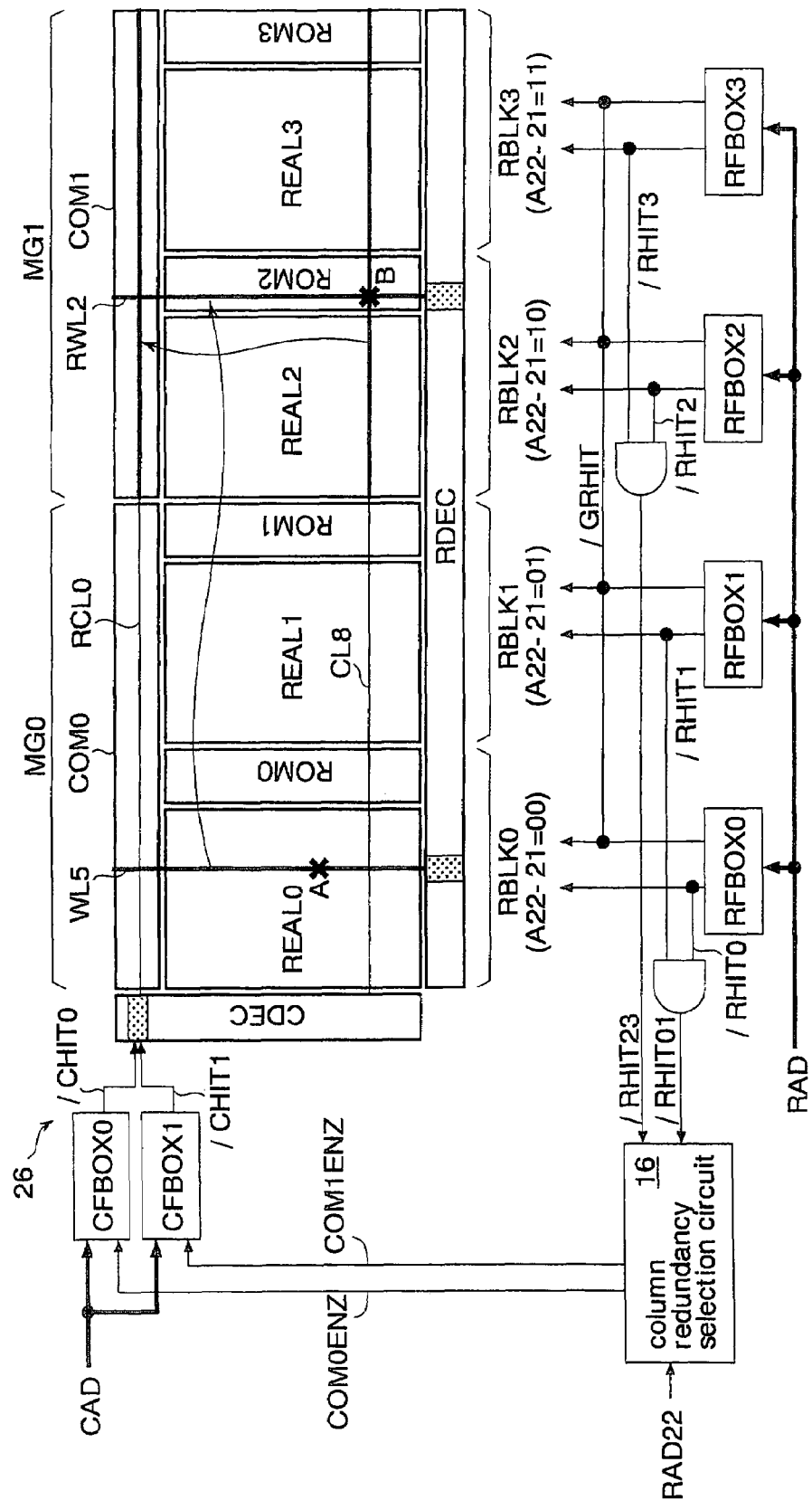
FIG. 2 is a block diagram showing the details of a memory core shown in FIG. 1.

The column redundancy selection circuit 16 outputs the enable signals COM0ENZ and COM1ENZ according to a row address signal RAD22 (block address signal) and row hit signals /RHIT01 and /RHIT23 (see FIG. 2). The details of the column redundancy selection circuit 16 will be described later with reference to FIG. 4.

The address input circuit 18 receives an address signal AD (AD0-22) via address terminals AD and outputs the received signal as an external row address signal RAD (RAD9-22) and an external column address signal CAD (CAD0-8). The FCRAM in this figure is an address non-multiplexing type memory which receives a row address signal RAD and a column address signal CAD simultaneously. The predecoder 20 decodes the row address signal RAD and generates a row decoding signal RAZ. The predecoder 22 decodes the column address signal CAD and generates a column decoding signal CAZ.

The data input/output circuit 24 receives read data from memory cells MC via a common data bus CDB and outputs the received data to data terminals DQ. Further, the data input/output circuit 24 receives write data via the data terminals DQ and outputs the received data to the common data bus CDB.

The memory core 26 is equipped with a cell array ARY, a sense amplifier part SA, a precharge part PRE, a row decoder part RDEC, a column switch part CSW, a column decoder part CDEC, a read amplifier part RA, and a write amplifier part WA. The cell array ARY has plural volatile dynamic memory cells MC and plural word lines WL and plural bit line pairs BL and /BL that are connected to the dynamic memory cells MC.

Each memory cell MC, which is the same as each memory cell of general DRAMs, has a capacitor for holding data in the form of charge and a transfer transistor that is disposed between the capacitor and a bit line BL (or /BL). The gate of the transfer transistor is connected to the word line WL. One of a read operation, a write operation, and a refresh operation is performed by selecting the word line WL. After performing one of a read operation, a write operation, and a refresh operation, the cell array ARY performs a precharge operation for precharging the bit lines BL and /BL to a prescribed voltage in synchronism with activation of the bit line reset signal BRS to the high logic level.

The sense amplifier part SA has plural sense amplifiers. Each sense amplifier operates in synchronism with activation of the sense amplifier activation signal LEZ and amplifies the signal amount of data on the bit line BL or /BL. Data that has been amplified by each sense amplifier is transmitted to a global data bus GDB via a column switch in a read operation and is written to a memory cell MC via the bit line BL or /BL in a write operation.

The precharge part PRE has plural precharge circuits that are connected to the respective bit lines BL and /BL. Each precharge circuit operates in synchronism with activation (to the high logic level) of the bit line reset signal BRS and connects the bit lines BL and /BL to a precharge voltage line.

When receiving a word line activation signal WLZ having the high logic level, the row decoder part RDEC selects one of the word lines WL according to the row decoding signal RAZ and changes the voltage of the selected word line WL to the high level. When receiving an activated global row hit signal /GRHIT, the row decoder part RDEC prohibits selection of the word line WL and selects a redundancy word line RWL corresponding to the row hit signal /RHIT.

Figure 3:
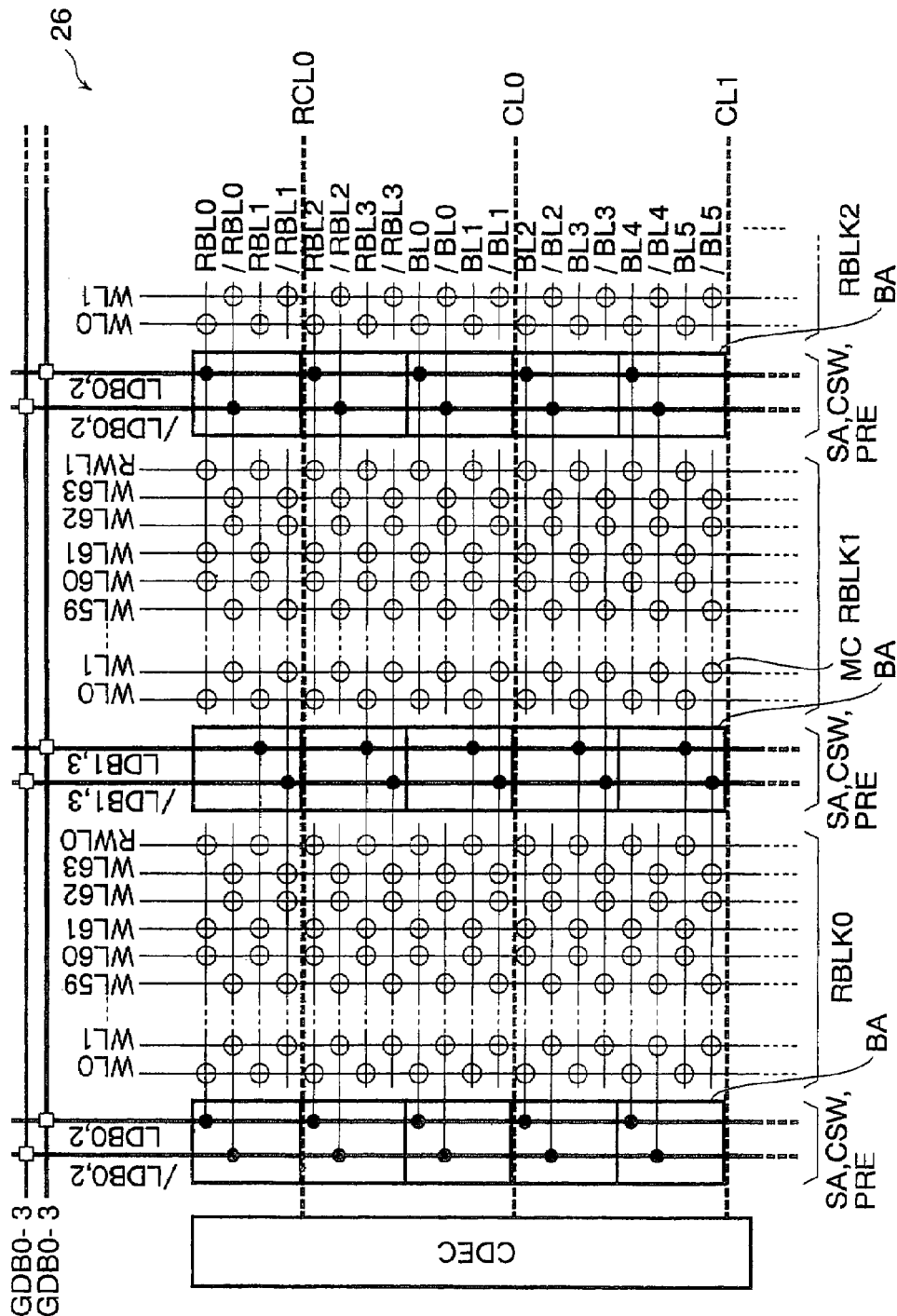
FIG. 3 is a layout diagram outlining the memory core of FIG. 2.

The column switch part CSW has plural column switches each of which serves to connect the bit lines BL and /BL to a local data bus LDB (see FIG. 3). Each column switch connects the associated bit lines BL and /BL (RBL and /RBL) to the associated local data bus LDB while a column selection signal CL (RCL; described below) is activated. The column decoder part CDEC outputs the column selection signal CL (RCL) to turn on a column switch according to the column decoding signal CAZ.

The read amplifier part RA has plural read amplifiers. Each read amplifier amplifies the signal amount of read data on the associated data bus DB and outputs resulting data to the common data bus CDB. The write amplifier part WA has plural write amplifiers. Each write amplifier amplifies the signal amount of write data on the common data bus and output resulting data to the associated data bus DB.

FIG. 2 shows the details of the memory core 26 shown in FIG. 1. The memory core 26 is equipped with four real cell arrays REAL0-3 each of which has plural memory cells (real memory cells) arranged in matrix form and row redundancy cell arrays ROM0-3 which are adjacent to the respective real memory cell arrays REAL0-3 and each of which has plural row redundancy memory cells arranged in the row direction (in the vertical direction in FIG. 2). The real cell array REAL0 and the row redundancy cell array ROM0 constitute a row block RBLK0. Likewise, the real cell arrays REAL1-3 and the row redundancy cell arrays ROM1-3 constitute row blocks RBLK1-3, respectively. When the row redundancy cell arrays ROM0-3 are not used, selection among the row blocks RBLK0-3 is made according to 2-bit row address signals RAD22-21.

Each of the row redundancy cell arrays ROM0-3 has plural (e.g., two or four) redundancy word lines RWL that are connected to the row redundancy memory cells. However, in this embodiment, to simplify the description, it is assumed that a single redundancy word line RWL is formed in each of the row redundancy cell arrays ROM0-3.

As shown in FIG. 2, column redundancy cell arrays COM0 and COM1 each of which has plural column redundancy memory cells arranged in the column direction (in the horizontal direction in FIG. 2) are formed over the real cell arrays REAL0-1 and REAL2-3, respectively. That is, the column redundancy cell arrays COM0 and COM1 are formed so as to be common to the row blocks RBLK0-1 and RBLK2-3, respectively. The column redundancy memory cells are connected to redundancy bit lines which are wired in the column direction.

The column redundancy cell arrays COM0-1 have plural (e.g., two or four) redundancy column selection lines RCL which are common to the column redundancy cell arrays COM0-1. However, in this embodiment, to simplify the description, it is assumed that a single common redundancy column selection line RCL0 is formed in the column redundancy cell arrays COM0-1. Wiring the redundancy column selection line RCL0 so as to be common to the column redundancy cell arrays COM0-1 makes it possible to independently relieve a bit line pair BL and /BL of the row blocks RBLK0-1 (column redundancy) and a bit line pair BL and /BL of the row blocks RBLK2-3 using the single redundancy column selection line RCL0.

The real cell array REAL0, the row redundancy cell array ROM0, and part of the column redundancy cell array COM0 constitute the row block RBLK0 (memory block). Likewise, the real cell arrays REAL1-3, the row redundancy cell arrays ROM1-3, and parts of the column redundancy cell arrays COM0-1 constitute the row blocks RBLK1-3 (memory blocks), respectively. Since the row redundancy cell array ROM (redundancy word line) and the column redundancy cell array COM (redundancy bit line) are formed in every row block RBLK0, 1, 2, or 3, the row blocks RBLK0-3 can be given the same structure. Since the lengths of the bit lines and the redundancy bit lines of all the row blocks RBLK0-3 can be made identical, all the bit lines and the redundancy bit lines can be given the same load capacitance. As a result, the electric characteristics during an access operation such as the read operation time and the write operation time can be made identical for all the row blocks RBLK0-3.

The two sets of adjoining row blocks RBLK0-1 and RBLK2-3 constitute the two memory groups MG0-1. The memory groups MG0-1 are divided so as to correspond to the respective column redundancy cell arrays COM0-1. Selection between the memory groups MG0-1 is made according to the logic level of the row address signal RAD22 (block address signal).

The row redundancy circuits RFBOX0-3 output respective row hit signals /RHIT0-3 and a global row hit signal /GRHIT. A row hit signal /RHIT01 is generated by ORing (negative logic) the logical values of the row hit signals /RHIT0-1. Likewise, a row hit signal /RHIT23 is generated by ORing (negative logic) the logical values of the row hit signals /RHIT2-3 that are output from the row redundancy circuits RFBOX2-3. The global row hit signal /GRHIT is transmitted by a global row hit signal line /GRHIT which is common to the row blocks RBLK0-3. The global row hit signal line /GRHIT is wired parallel with the row decoder RDEC.

In this embodiment, since the row redundancy cell arrays ROM0-3 are formed in the respective row blocks RBLK0-3, relief from a failure occurring in one of the real cell arrays REAL0-3 can be attained by using the row redundancy cell array ROM0, 1, 2, or 3 of an arbitrary one of the row blocks RBLK0-3. For example, where the row redundancy cell arrays ROM0-1 are already used, the row redundancy cell array ROM2 (redundancy word line RWL2) of the row block RBLK2 can be used for relief from a failure "A" occurring in the real cell array REAL0 (real word line WL5). Relieving a word line WL using an arbitrary one of the row redundancy cell arrays ROM0-3 can increase the failure relief efficiency. In particular, when failures have occurred in a certain row block RBLK in a concentrated manner, the relief efficiency can be increased greatly by attaining relief from those failures by using the redundancy word lines of plural row blocks RBLK including the row block RBLK where the failures have occurred.

When a failure "B" exists in the row redundancy memory cell, corresponding to the column selection line CL8, among the row redundancy cells connected to the redundancy word line RWL2, relief from the failure "B" can be attained by a redundancy bit line of the column redundancy cell array COM1, for example, by using the redundancy column selection line RCL0. In this case, when receiving an external address signal AD (RAD and CAD) for accessing the word line WL5, the FCRAM according to this embodiment can correctly access the column redundancy circuit COM1 rather than the column redundancy circuit COM0 by virtue of operation of the column redundancy selection circuit 16. This makes it possible to use a redundancy word line and a redundancy bit line simultaneously and to thereby increase the failure relief efficiency further.

FIG. 3 outlines a layout of the memory core 26 of FIG. 2. For example, each of the row blocks RBLK0-3 has 64 word lines WL (WL0-WL63) and one redundancy word line RWL (RWL0, 1, 2, or 3). Each white circle at the intersection of a word line WL or RWL and a bit line BL, /BL, RBL, or /RBL indicates a memory cell MC (real memory cell, row redundancy memory cell, or column redundancy memory cell). The sense amplifier part SA, the column switch part CSW, the precharge part PRE, and bit line transfer switches (not shown) are formed in boundary areas BA located beside or between the row blocks RBLK0-3. A boundary area BA interposed between two row blocks RBLK is used by both row blocks RBLK. To connect the bit line pairs BL and /BL (RBL and /RBL) to the circuits in the boundary areas BA, the bit line transfer switches (not shown) are formed on both sides of each boundary area BA (i.e., adjacent to the row blocks RBLK).

Local data bus lines LDB0,2 and /LDB0,2 (or LDB1,3 and /LDB1,3) are wired in each boundary area BA. The local data bus lines LDB0-3 and /LDB0-3 are connected to the bit line pairs BL and /BL (RBL and /RBL) via the column switches (redundancy column switches) indicated by black circles in FIG. 3.

For example, when the word line WL1 of the row block RBLK0 is selected and a read operation is performed, only the bit line pairs BL and /BL (RBL and /RBL) of the row block RBLK0 continue to be connected to the sense amplifiers SA in the boundary areas BA because of turning-on of the corresponding bit line transfer switches. The bit line pairs BL and /BL (RBL and /RBL) of the other row blocks RBLK1-3 are disconnected from the sense amplifiers SA because of turning-off of the corresponding bit line transfer switches.

Data that have been read out to even-numbered bit line pairs BL and /BL (RBL and /RBL) are amplified by the sense amplifiers SA that are formed in the boundary area BA located on the left of the row block RBLK0. Data that have been read out to odd-numbered bit line pairs BL and /BL (RBL and /RBL) are amplified by the sense amplifiers SA that are formed in the boundary area BA located on the right of the row block RBLK0.

One of the column selection lines CL (CL0, CL1, . . . ) and the redundancy column selection line RCL0 is activated to the high logic level. If the column selection line CL0, for example, is activated, only the column switches connected to the bit line pairs BL0-3 and /BL0-3 are turned on and the data that have been amplified by the sense amplifiers SA are transmitted to the local data bus lines LDB0-3 and /LDB0-3 via those column switches. At this time, the column switches irrelevant to the row block RBLK0 are also turned on. However, since the voltages of the bit line pairs BL and /BL (RBL and /RBL) and the local data bus lines LDB0-3 and /LDB0-3 that are connected to those column switches are set to the precharge voltage, the turning-on those column switches does not influence the read operation. Likewise, if the redundancy column selection line RCL0 is activated, only the column switches connected to the redundancy bit line pairs RBL0-3 and /RBL0-3 are turned on and data that have been amplified by the sense amplifiers SA are transmitted to the local data bus lines LDB0-3 and /LDB0-3 via those column switches.

Further, bus switches (indicated by squares in FIG. 3) that connect the global data bus lines GDB0-3 and /GDB0-3 to the local data bus lines LDB0-3 and /LDB0-3 corresponding to the row block RBLK0 are turned on. The data that have been read from the row block RBLK0 are transmitted to the read amplifier part RA (see FIG. 1) via the global data bus lines GDB0-3 and /GDB0-3. In the actual FCRAM, four circuit blocks are formed that are the same as the circuit block of FIG. 3 and 16-bit data are input and output by those four circuit blocks.

Figure 4:
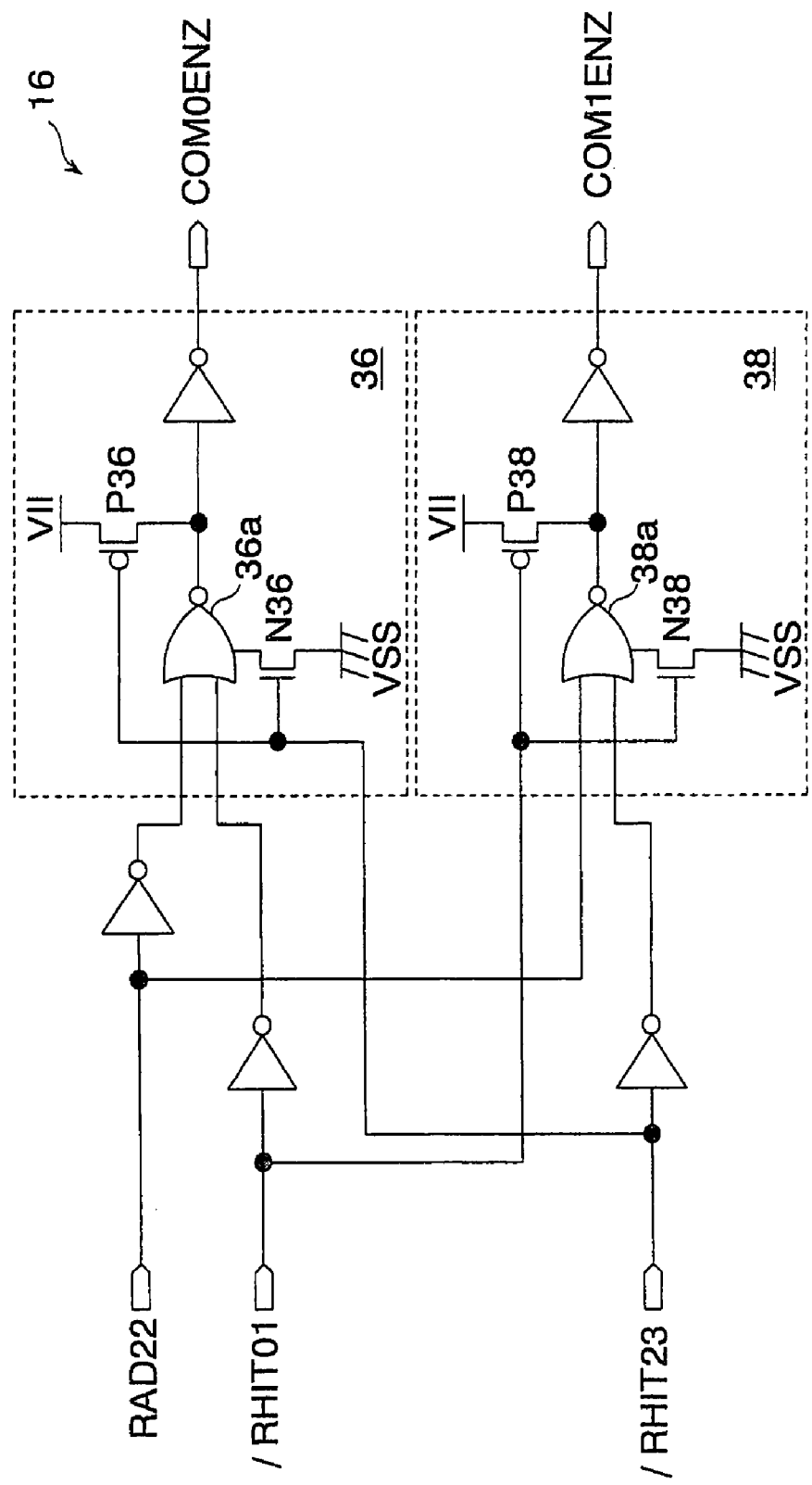
FIG. 4 is a circuit diagram showing the details of a column redundancy selection circuit shown in FIG. 2.

FIG. 4 shows the details of the column redundancy selection circuit 16 shown in FIG. 2.

The column redundancy selection circuit 16 is equipped with address decoders 36 and 38 which output the respective enable signals COM0ENZ and COM1ENZ. The address decoders 36 and 38 are the same circuit. Each of the address decoders 36 and 38 is equipped with a 2-input NOR gate 36*a* or 38*a*, a pMOS transistor P36 or P38 which connects the output of the NOR gate 36*a* or 38*a* to an internal supply voltage line VII, and an nMOS transistor N36 or N38 for deactivating the NOR gate 36*a* or 38*a*. The NOR gate 36*a* or 38*a* operates as a decoder part for activating the enable signal COM0ENZ or COM1ENZ in response to activation of the row address signal RAD 22 or the corresponding row hit signal /RHIT01 or /RHIT23.

The NOR gate 36*a* receives an inverted signal of the row address signal RAD22 and an inverted signal of the row hit signal /RHIT01. The NOR gate 38*a* receives the row address signal RAD22 and an inverted signal of the row hit signal /RHIT23. The gates of the pMOS transistor P36 and the nMOS transistor N36 of the address decoder 36 receives the row hit signal /RHIT23 and the gates of the pMOS transistor P38 and the nMOS transistor N38 of the address decoder 38 receives the row hit signal /RHIT01. The pMOS transistor P36 or P38 and the nMOS transistor N36 or N38 of each of the address decoders 36 and 38 operates as a reset part for fixing the output node of the enable signal COM0ENZ or COM1ENZ (i.e., the output of the NOR gate 36*a* or 38*a*) at the deactivation level in response to activation of the uncorresponding row hit signal /RHIT23 or /RHIT01.

The column redundancy selection circuit 16 can be formed easily by using logic circuits, pMOS transistors, and nMOS transistors. Since the column redundancy selection circuit 16 can be constructed with simple logic, the circuit design can be simplified.

FIG. 5 shows how the column redundancy selection circuit 16 of FIG. 4 operates. The column redundancy selection circuit 16 activates one of the enable signals COM0ENZ and COM1ENZ to the high logic level according to the row address signal RAD22 when the row hit signals /RHIT01 and /RHIT23 are at the high logic level (H), that is, when the row redundancy cell arrays ROM0-3 are not used. The column redundancy selection circuit 16 sets the enable signals COM0ENZ and COM1ENZ at the high logic level and the low logic level, respectively, when the row hit signal /RHIT01 is at the low logic level (L), that is, when at least one of the row redundancy cell arrays ROM0-1 is used. The column redundancy selection circuit 16 sets the enable signals COM0ENZ and COM1ENZ at the low logic level and the high logic level, respectively, when the row hit signal /RHIT23 is at the low logic level, that is, when at least one of the row redundancy cell arrays ROM2-3 is used.

Supplying the plural row hit signals /RHIT01 and /RHIT23 to the column redundancy selection circuit 16 and causing it to perform a logical operation including those row hit signals /RHIT01 and /RHIT23 and the row address signal RAD22 makes it possible to use, for failure relief, not only the row redundancy circuit for the adjacent row block RBLK but also that for an arbitrary row block RBLK. Further, as described above, the column redundancy selection circuit 16 makes it possible to use a redundancy word line and a redundancy bit line simultaneously and to thereby increase the failure relief efficiency.

As described above, according to the first embodiment, the column redundancy circuit CFBOX0 or CFBOX1 for the memory group MG0 or MG1 whose redundancy word line is used can be made effective according to the row hit signals /RHIT01 and /RHIT23 and the failure relief efficiency can thereby be increased. In particular, when failures have occurred in a certain memory block in a concentrated manner, the failure relief efficiency can be increased by attaining failure relief using redundancy word lines of plural memory blocks including the memory block where the failures have occurred. As a result, the failure relief efficiency can be made higher without deteriorating the electric characteristic during an access operation.

Figure 6:
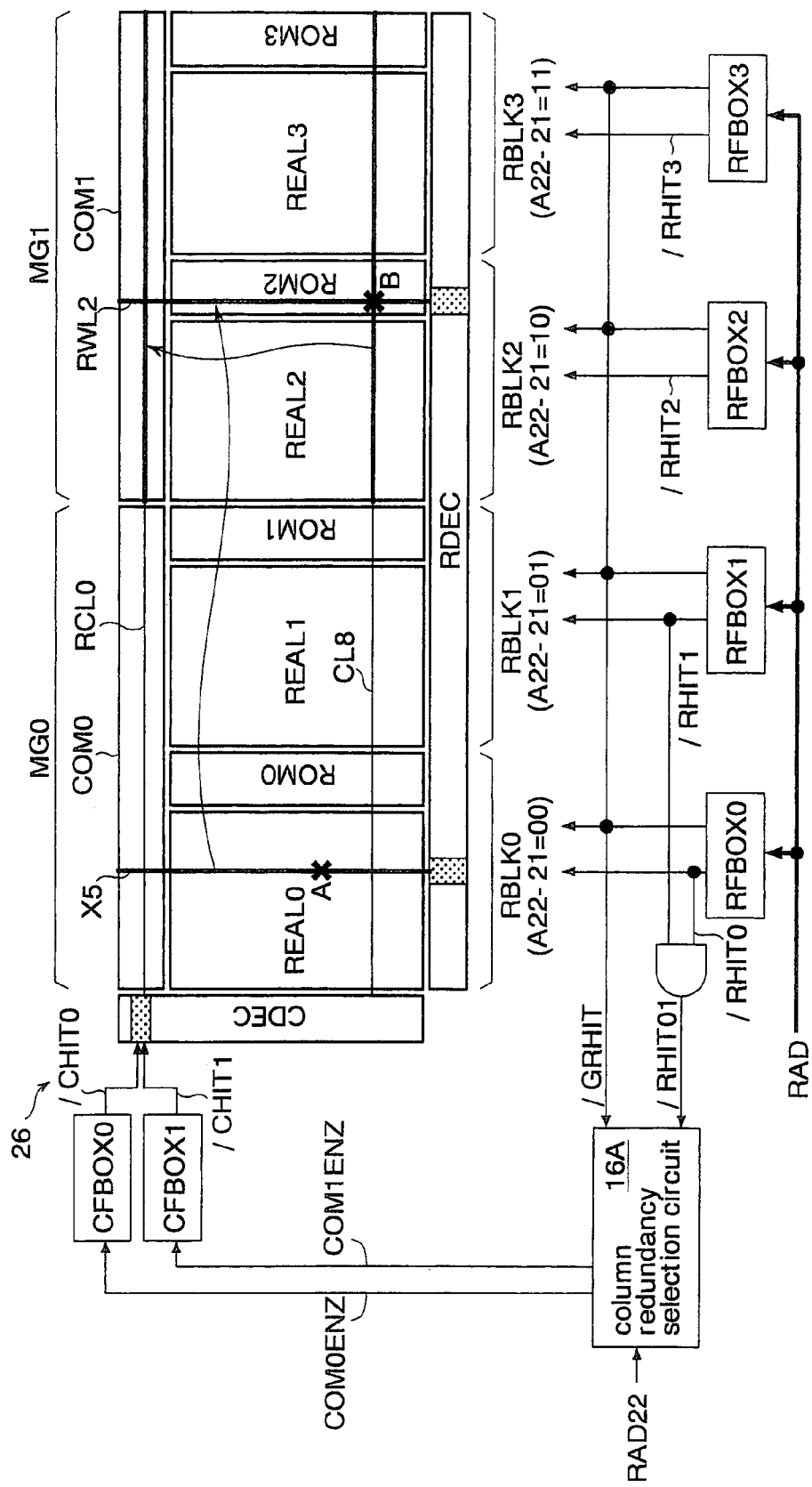
FIG. 6 is a block diagram showing the details of a memory core according to a second embodiment of the invention.

FIG. 6 shows the details of a memory core according to a second embodiment of the invention. Components having the same components in the first embodiment are given the same reference symbols as the latter and will not be described in detail. In this embodiment, a column redundancy selection circuit 16A is formed instead of the column redundancy selection circuit 16 of the first embodiment. The other part of the configuration is the same as in the first embodiment. That is, this semiconductor memory is an FCRAM. The column redundancy selection circuit 16A outputs the enable signals COM0ENZ and COM1ENZ according to the row address signal RAD22 (block address signal), the row hit signal /RHIT01, and the global row hit signal /GRHIT.

More specifically, the column redundancy selection circuit 16A receives the row hit signal /RHIT01 (close row hit signal) which is OR logic of the row hit signals /RHIT0-1 from the row redundancy circuits RFBOX0-1 corresponding to the memory group MG0 which is located relatively near by. The column redundancy selection circuit 16A receives the global row hit signal /GRHIT instead of the row hit signals /RHIT2-3 from the row redundancy circuits RFBOX2-3 corresponding to the memory group MG1 which is located relatively away in distance.

The global row hit signal /GRHIT is a signal that is supplied to all the row blocks RBLK0-3 along the row decoder RDEC, and its signal line is wired to a position close to the column redundancy selection circuit 16A. Therefore, utilizing the global row hit signal /GRHIT makes it unnecessary to wire a signal line of the row hit signal /RHIT23 which is OR logic of the row hit signals /RHIT2-3.

Figure 7:
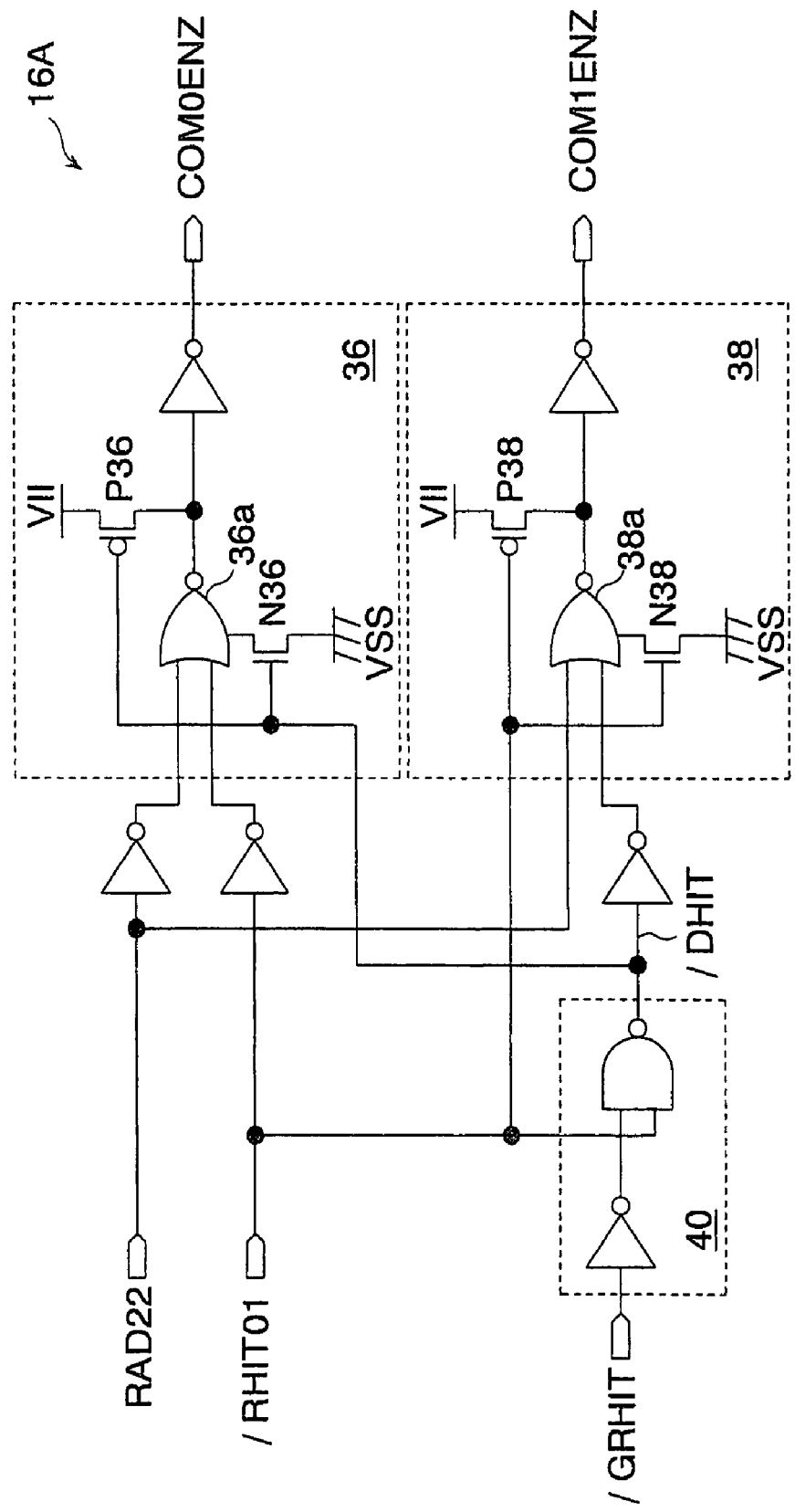
FIG. 7 is a circuit diagram showing the details of a column redundancy selection circuit shown in FIG. 6.

FIG. 7 shows the details of the column redundancy selection circuit 16A shown in FIG. 6. Components having the same components in the first embodiment (FIG. 4) will not be described below. The column redundancy selection circuit 16A is equipped with an operation circuit 40 which performs a logical operation including the row hit signal /RHIT01 and the global row hit signal /GRHIT. The address decoders 36 and 38 receive a dummy hit signal /DHIT which is output from the operation circuit 40 and its inverted signal instead of the row hit signal /RHIT23 and its inverted signal, respectively. The operation circuit 40 generates the dummy hit signal /DHIT by calculating NAND logic of the inverted logic of the global row hit signal /GRHIT and the row hit signal /RHIT01.

The FCRAM according to this embodiment is equipped with the pair of memory groups MG0-1. Therefore, when one of the row hit signals /RHIT2 and /RHIT3 is activated, the row hit signal /RHIT01 is deactivated and the global row hit signal /GRHIT is activated. That is, the dummy hit signal /DHIT is a signal having the same logic as the row hit signal /RHIT23 of the first embodiment.

FIG. 8 shows how the column redundancy selection circuit 16A of FIG. 7 operates. The column redundancy selection circuit 16A activates one of the enable signals COM0ENZ and COM1ENZ to the high logic level according to the row address signal RAD22 when the row hit signal /RHIT01 and the global row hit signal /GRHIT are at the high logic level (H), that is, when the row redundancy cell arrays ROM0-3 are not used.

The column redundancy selection circuit 16A sets the enable signals COM0ENZ and COM1ENZ at the high logic level and the low logic level, respectively, when the row hit signal /RHIT01 is at the low logic level (L), that is, when at least one of the row redundancy cell arrays ROM0-1 is used. The column redundancy selection circuit 16A sets the enable signals COM0ENZ and COM1ENZ at the low logic level and the high logic level, respectively, irrespective of the row address signal RAD22 when the row hit signal /RHITO01 is at the high logic level and the global row hit signal /GRHIT is at the low logic level, that is, when at least one of the row redundancy cell arrays ROM2-3 is used.

As described above, the second embodiment provides the same advantages as the above-described first embodiment. In addition, utilizing the global row hit signal /GRHIT instead of the row hit signals /RHIT2-3 from the row redundancy circuits RFBOX2-3 corresponding to the memory group MG1 which is distantly located makes it possible to omit signal lines for transmitting the row hit signals /RHIT2-3 to the column redundancy selection circuit 16A. As a result, the number of interconnections formed in the FCRAM can be decreased and its chip size can be reduced.

Figure 9:
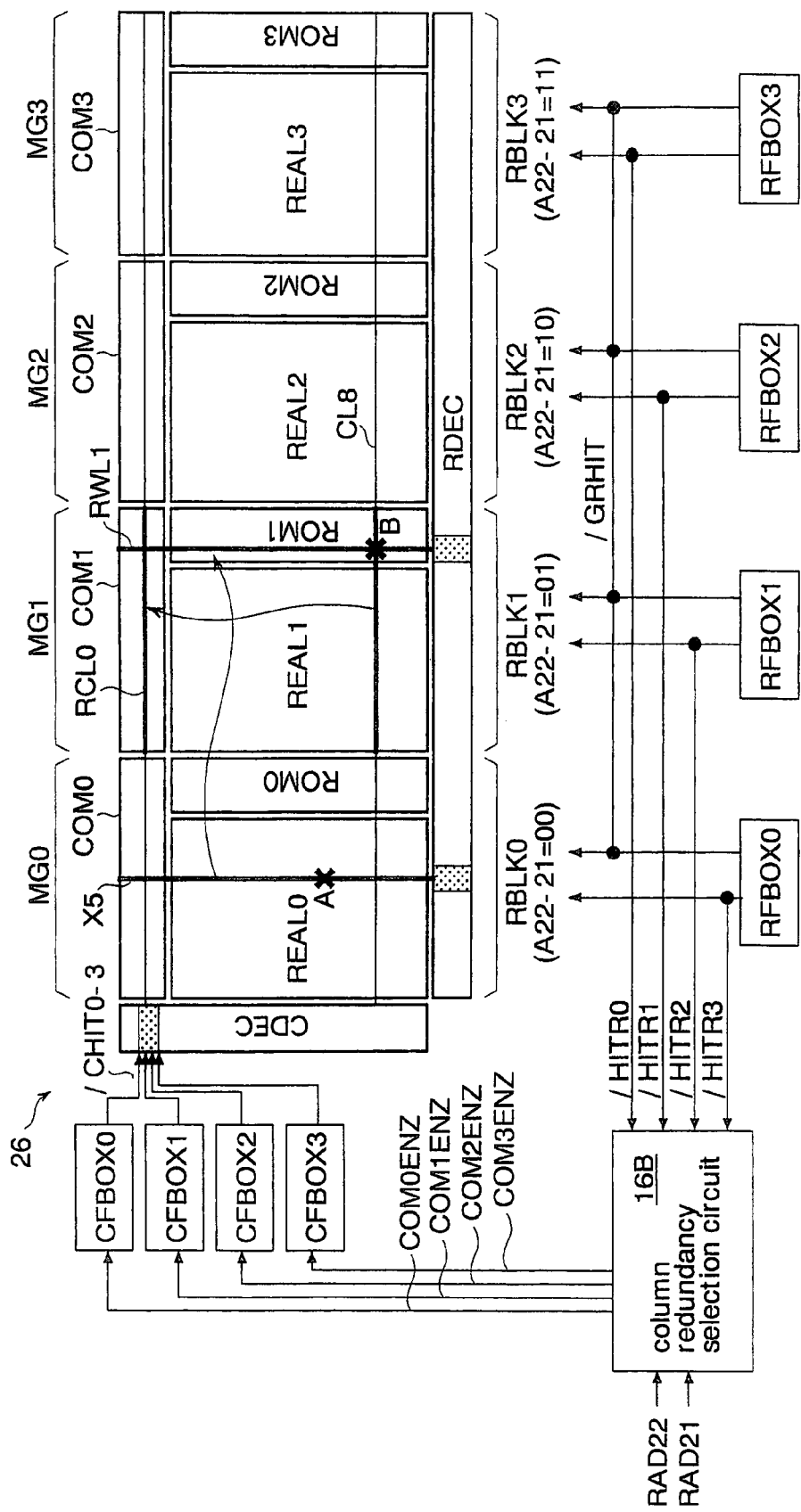
FIG. 9 is a block diagram showing the details of a memory core according to a third embodiment of the invention.

FIG. 9 shows the details of a memory core according to a third embodiment of the invention. Components having the same components in the first embodiment are given the same reference symbols as the latter and will not be described in detail. In this embodiment, a column redundancy selection circuit 16B is formed instead of the column redundancy selection circuit 16 of the first embodiment. Further, column redundancy cell arrays COM0-3 are formed so as to correspond to the respective row blocks RBLK0-3 and column redundancy circuits CFBOX0-3 are formed so as to correspond to the respective column redundancy cell arrays COM0-3. The other part of the configuration is the same as in the first embodiment. That is, this semiconductor memory is an FCRAM.

The column redundancy selection circuit 16B outputs enable signals COM0ENZ, COM1ENZ, COM2ENZ, and COM3ENZ according to the row address signals RAD21-22 (block address signals) and the row hit signals /RHIT0-3. The column redundancy circuits CFBOX0-3 receive the respective enable signals COM0ENZ, COM1ENZ, COM2ENZ, and COM3ENZ. The column redundancy circuits CFBOX2-3 have the same configuration as the column redundancy circuits CFBOX0-1 (see FIG. 1).

In this embodiment, the column redundancy cell arrays COM0-3 are formed so as to correspond to the respective row blocks RBLK0-3. Therefore, bit line relief can be attained on a row block basis (RBLK0-3). For example, if a failure B exists in a row redundancy memory cell corresponding to the column selection line CL8 among the row redundancy memory cells that are connected to the redundancy word line RWL1 that is used for relief from a failure A, relief from the failure B can be attained by the column redundancy cell array COM1 (redundancy bit line) using the redundancy column selection line RCL0. As a result, as in the case of the first embodiment, it becomes possible to use a redundancy word line and a redundancy bit line simultaneously and to thereby increase the failure relief efficiency further.

Figure 10:
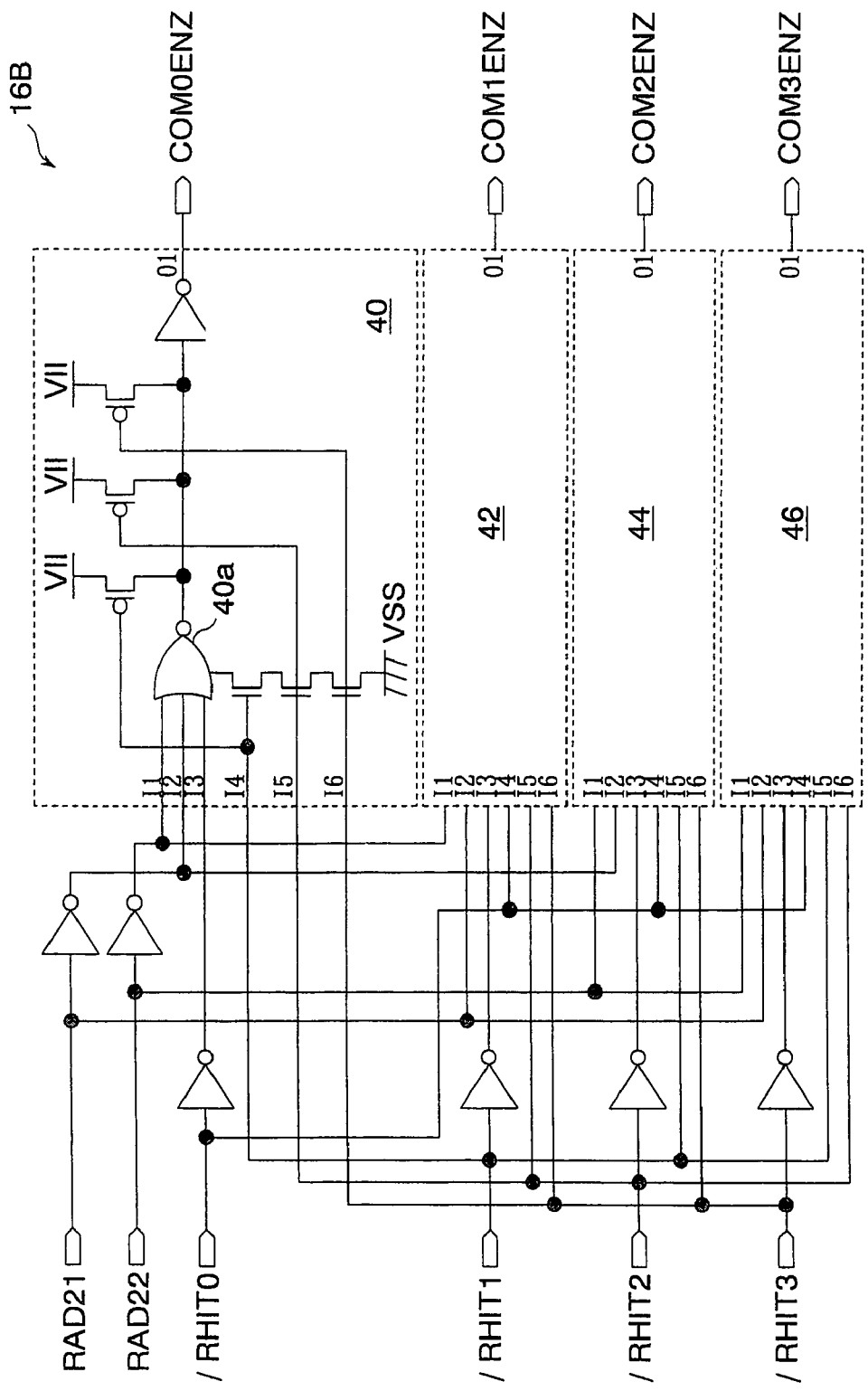
FIG. 10 is a circuit diagram showing the details of a column redundancy selection circuit shown in FIG. 9.

FIG. 10 shows the details of the column redundancy selection circuit 16B as shown in FIG. 9. The column redundancy selection circuit 16B is equipped with address decoders 40, 42, 44, and 46 which output the respective enable signals COM0ENZ, COM1ENZ, COM2ENZ, and COM3ENZ. The address decoders 40, 42, 44, and 46 are the same circuit, and hence only the address decoder 40 will be described below.

The address decoder 40 is equipped with a 3-input NOR gate 40a, three PMOS transistors that connect the output of the NOR gate 40a to an internal supply voltage line VII, and a series connection of three nMOS transistors that is provided to deactivate the three pMOS transistors and the NOR gate 40a. The NOR gate 40a operates as a decoder part for activating the enable signal COM0ENZ according to inverted signals of the row address signals RAD21-22 and an inverted signal of the corresponding row hit signal /RHIT0. The gates of the pMOS transistors and the nMOS transistors receive the uncorresponding row hit signals /RHIT1-3, respectively. The pMOS transistors and the nMOS transistors operate as a reset part for fixing the output node of the enable signal COM0ENZ (i.e., the output of the NOR gate 40a) at the deactivation level in response to activation of the uncorresponding row hit signals /RHIT1-3.

Like the address decoder 40, each of the address decoders 42, 44, and 46 is such that the NOR gate receives the row address signals RAD21-22 or their inverted signals and an inverted signal of the corresponding row hit signal /RHIT1, 2, or 3 and the gates of the pMOS transistors and the nMOS transistors receive the uncorresponding row hit signals /RHIT.

FIG. 11 shows how the column redundancy selection circuit 16B operates as shown in FIG. 10. The column redundancy selection circuit 16B activates one of the enable signals COM0ENZ, COM1ENZ, COM2ENZ, and COM3ENZ to the high logic level according to the row address signals RAD21-22 when all the row hit signals /RHIT0-3 are at the high logic level (H), that is, when the row redundancy cell arrays ROM0-3 are not used. The column redundancy selection circuit 16B sets the corresponding enable signal (one of COM0ENZ, COM1ENZ, COM2ENZ, and COM3ENZ) at the high logic level irrespective of the row address signals RAD21-22 when one of the row hit signals /RHIT0-3 is at the low logic level (L), that is, when one of the row redundancy cell arrays ROM0-3 is used.

As described above, the third embodiment provides the same advantages as the above-described first embodiment. In addition, even in the case where the more memory groups MG0-3 are formed, the column redundancy selection circuit 16B can be formed with simple logic and the relief efficiency can be increased. In particular, the relief efficiency can be increased because bit line relief can be attained on a row block basis (RBLK0-3).

The above embodiments are directed to the case that the cell array ARY consists of two or four memory groups. However, the cell array ARY may include eight or more memory groups. Also in this case, a column redundancy selection circuit can be constructed with simple logic.

The above embodiments are such that the invention is applied to the FCRAM. However, the invention may be applied to a DRAM or a pseudo SRAM. Further, the application field of the invention is not limited to FCRAM chips, DRAM chips, and pseudo SRAM chips and encompasses system LSIs incorporating the memory core of any of those memories.

The invention is not limited to the above embodiments and various modifications may be made without departing from the spirit and scope of the invention. Any improvement may be made in part or all of the components.

What is claimed is:

1. A semiconductor memory circuit on a semiconductor substrate comprising:
   a plurality of memory blocks on the semiconductor substrate, each of which includes a real cell array, a row redundancy cell array having at least a redundant word line, and a column redundancy cell array having at least a redundant column line;
   a plurality of row redundancy circuits on the semiconductor substrate, each of which is coupled to a corresponding memory block and includes a comparator configured to compare a failure row address with a row address signal including a block address signal and output a row hit signal to select a corresponding redundant word line when the row address signal coincides with the failure row address, the block address signal indicating one of the plurality of memory blocks;
   a plurality of column redundancy circuits on the semiconductor substrate, each of which is coupled to a corresponding memory block, configured to operate in response to an enable signal, and includes a comparator configured to compare a failure column address with a column address signal and output a column hit signal to select a corresponding redundant column line when the column address signal coincides with the failure column address; and
   a column redundancy selection circuit configured to receive the row hit signal and the block address signal, wherein the column redundancy selection circuit (i) outputs the enable signal to activate the memory block corresponding to the block address signal when the row hit signal is deactivated and (ii) outputs the enable signal to activate the memory block corresponding to the row hit signal when the row hit signal is activated.

2. The semiconductor memory according to claim 1, further comprising:
an address input circuit configured to receive an address signal including at least one of the column address signal and the row address signal from an address terminal.

3. The semiconductor memory according to claim 1, further comprising:
a row decoder selecting the redundant word line corresponding to the row hit signal.

4. The semiconductor memory according to claim 1, wherein the row redundancy circuit outputs a global row hit signal to prohibit a row decoder to select a word line.

5. The semiconductor memory according to claim 1, wherein the column redundancy selection circuit performs a logical operation with the row hit signal and the memory address signal and generates an enable signal.

6. The semiconductor memory according to claim 1, wherein the row redundancy circuit includes a first circuit that stores the failure row address and the column redundancy circuit includes a second circuit that stores a failure column address.

7. The semiconductor memory according to claim 1, wherein one column redundancy circuit is provided with two or more memory blocks of the plurality of memory blocks.

8. A semiconductor memory system comprising:
an address terminal configured to receive a row address signal and an column address signal from external;
a plurality of memory blocks, each of which includes a real cell array, a row redundancy cell array having at least a redundant word line, and a column redundancy cell array having at least a redundant column line;
a plurality of row redundancy circuits, each of which is coupled to a corresponding memory block, configured to receive a row address signal including a memory block address and output a row hit signal to select a corresponding redundant word line;
a plurality of column redundancy circuits, each of which is coupled to a corresponding memory block, to configured to receive the column address and output a column hit signal to select a corresponding redundant column line; and
an column redundancy selection circuit configured to receive the row hit signal and the block address signal, wherein the column redundancy selection circuit performs a logical operation with the row hit signal and the memory address signal and outputs an enable signal to the redundancy column circuit so that the redundancy word line and the redundancy column line is selected simultaneously.

9. The semiconductor memory system according to claim 8, wherein the column redundancy selection circuit outputs the enable signal to activate the memory block corresponding to the block address signal when the row hit signal is deactivated and outputs the enable signal to activate the memory block corresponding to the row hit signal when the row hit signal is activated.

10. The semiconductor memory system according to claim 8, further comprising:
a data input/output terminal configured to input data from external to transfer data to a row redundancy cell specified by the selected corresponding redundant word line or a column redundancy cell specified by the selected corresponding redundant column line and configured to output data from the row redundancy cell specified by the selected corresponding redundant word line or the column redundancy cell specified by the selected corresponding redundant column line.

* * * * *